(12) United States Patent
Bielak

(10) Patent No.: US 9,067,402 B1
(45) Date of Patent: Jun. 30, 2015

(54) FORMING AN IMAGE ON A FLEXOGRAPHIC MEDIA

(71) Applicant: Richard R. Bielak, Port Coquitlam (CA)

(72) Inventor: Richard R. Bielak, Port Coquitlam (CA)

(73) Assignee: EASTMAN KODAK COMPANY, Rochester, NY (US)

( * ) Notice: Subject to any disclaimer, the term of this patent is extended or adjusted under 35 U.S.C. 154(b) by 0 days.

(21) Appl. No.: 14/169,547

(22) Filed: Jan. 31, 2014

(51) Int. Cl.
  *G03F 7/00* (2006.01)
  *G03F 7/26* (2006.01)
  *B41C 1/10* (2006.01)
(52) U.S. Cl.
  CPC .................................. *B41C 1/1008* (2013.01)
(58) Field of Classification Search
  CPC ................................. B41F 5/24; G03F 7/0002
  USPC ........................................................... 430/306
  See application file for complete search history.

(56) References Cited

U.S. PATENT DOCUMENTS

2010/0028815 A1\* 2/2010 Zwadlo ......................... 430/325
2014/0087306 A1\* 3/2014 Blomquist et al. ......... 430/270.1

\* cited by examiner

*Primary Examiner* — Chanceity Robinson
(74) *Attorney, Agent, or Firm* — Nelson Adrian Blish

(57) ABSTRACT

A method for forming an image on a flexographic plate includes exposing a back of the flexographic plate to form a floor; providing a screened image; locating isolated dots on the screened image; exposing a front of the flexographic plate to form the image, isolated dots and scaffold dots adjacent to the isolated dots; wherein the scaffold dots do not extend to the floor; and applying a solvent to wash away the unexposed material and the scaffold dots from the flexographic plate.

4 Claims, 13 Drawing Sheets

FORMING AN IMAGE ON A FLEXOGRAPHIC MEDIA

CROSS REFERENCE TO RELATED APPLICATIONS

Reference is made to commonly-assigned copending U.S. patent application Ser. No. 14/169,566, filed Jan. 31, 2014, entitled APPARATUS FOR FORMING AN IMAGE ON A FLEXOGRAPHIC MEDIA, by Bielak.

FIELD OF THE INVENTION

The present invention relates to a method forming an image on a flexographic plate.

BACKGROUND OF THE INVENTION

In graphic arts technology, a number of well-established printing processes utilize image carriers with three-dimensional (3D) representation of data, the most popular of them being flexographic printing, which uses flexible relief plates or sleeves. In a traditional flexographic prepress process with chemical etching there is no possibility of fine control of relief properties other than depth of relief.

Specifically, the shape of the cross-section profile directly influences the quality of reproduction of small features such as highlight elements and/or file linework details, process tolerance to changes in pressure applied by plate and/or sleeve to substrate and other vital characteristics.

Flexographic printing uses a flexible relief plate to print on a wide variety of substrates including paper, cardboard, plastic, and metal films. The Kodak Flexcel NX plate is one such relief plate. The process used to produce an image on the plate usually comprises the following steps:
1. Exposing the back of the plate to UV light.
2. Exposing an intermediate film to the desired image.
3. Laminating the film to the top of the plate.
4. Exposing the plate though the film using UV light.
5. Removing the film.
6. Using a solvent to wash away the unexposed plate material.
7. Applying additional exposure to harden the plate.
8. Drying the plate to remove as much of the solvent as possible.

The back exposure is used to establish the floor of the plate. The intensity of the exposure decreases as the illumination penetrates the plate because of absorption in the plate material. Once the intensity drops below a threshold value, there is insufficient cross linking in the polymer comprising the plate and the remaining under-exposed polymer can be washed away. This is usually the top 0.5 mm of the plate. To form the relief, the front of the plate is exposed, through an image layer, with enough intensity that sufficient cross linking occurs all the way down to the plate floor.

For every opening in the image layer, a cone of UV light with an angle of about 40 degrees from the normal propagates through the plate forming cone shaped relief dots. A cross-section of a plate 500 is shown in FIG. 5. The following features are depicted in the cross-section 500: a solid area 504; an isolated dot 508; and an array of closely spaced dots created by a halftone screen 512. The height of the plate relief is shown by numeral 516 and plate floor by numeral 520.

Isolated dots, such as isolated dot 508, can be problematic. There may be insufficient exposure to solidly and anchor the dot to the plate floor 520. Even if the dot forms properly, excess printing pressure could cause the dot to deform during printing. The dots in the middle of the halftone array 512 fair better since they are supported to either side by nearby dots. However, dots at the edge of the array 512 could suffer from some of the same problems as the isolated dot 508. Dot deformation can cause a large objectionable blot to form on the printing substrate. This is called a scum dot in the industry. Ensuring good dot formation and eliminating the possibility of scum dot formation is the object of this invention.

Large dots can support themselves even in isolation. For the Flexcel NX plate, a minimum dot size of 4×4 pixels is usually sufficient to ensure proper dot formation in all cases. However, a large minimum dot in a halftone makes it difficult to print light grey tones. Bump curves or screening strategies are used to try to mitigate this problem with mixed success.

The typical plate relief is 20 mils (0.5 mm). Reducing the relief, improves the dots ability to stand on its own. The disadvantage is that over a long print run, dirt can collect in the wide areas of the floor and if sufficient dirt accumulates then this dirt will transfer to the substrate.

A method that has been successfully used in laser ablation mask plates (LAMS) is to deliberately expose dots 608 that are too small to properly form in the areas surrounding dots 604 that need additional support as is shown on a printing plate profile 600 in FIG. 6. There is some risk the dots may print despite the lower relief—ink may accumulate on the recessed dots over several print cycles and then transfer to the next substrate all at once. Debris accumulation may also be a problem.

Another method suggests small dots which are interspersed with large dots. Halftone screen 700 as is shown in FIG. 7. As halftone dots 704 become sparse, rather than remove a dot completely a halftone dot is replaced with small printing dot 708. This is not ideal but often the tonal value of the resulting halftone screen is less than the sparse array because the remaining dots have additional support.

SUMMARY OF THE INVENTION

Briefly, according to one aspect of the present invention a method for forming an image on a flexographic plate includes exposing a back of the flexographic plate to form a floor; providing a screened image; locating isolated dots on the screened image; exposing a front of the flexographic plate to form the image, isolated dots and scaffold dots adjacent to the isolated dots; wherein the scaffold dots do not extend to the floor; and applying a solvent to wash away the unexposed material and the scaffold dots from the flexographic plate.

These and other objects, features, and advantages of the present invention will become apparent to those skilled in the art upon a reading of the following detailed description when taken in conjunction with the drawings wherein there is shown and described an illustrative embodiment of the invention.

BRIEF DESCRIPTION OF THE DRAWINGS

FIG. 10 shows a two-dimensional top view of how a typical halftone in the highlights might look like;

DETAILED DESCRIPTION OF THE INVENTION

In the following detailed description, numerous specific details are set forth in order to provide a thorough understanding of the disclosure. However, it will be understood by those skilled in the art that the teachings of the present disclosure may be practiced without these specific details. In other instances, well-known methods, procedures, components and circuits have not been described in detail so as not to obscure the teachings of the present disclosure.

While the present invention is described in connection with one of the embodiments, it will be understood that it is not intended to limit the invention to this embodiment. On the contrary, it is intended to cover alternatives, modifications, and equivalents as covered by the appended claims.

Figure 1:
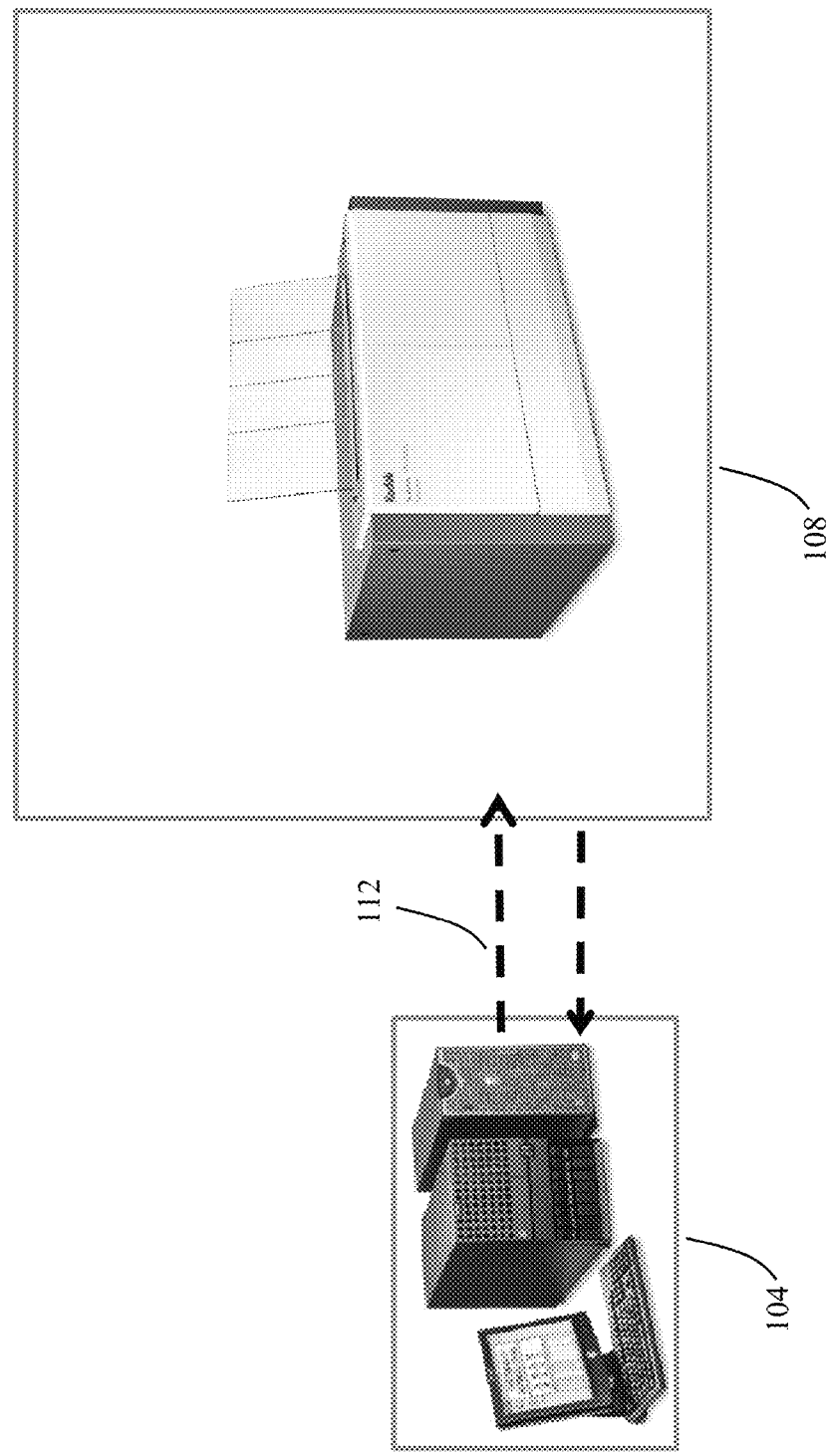
FIG. 1 represents, in diagrammatic form, a prior art digital front end driving an imaging device.

FIG. 1 shows an imaging device 108. The imaging device is driven by a digital front end (DFE) 104, which comprises a computer or microprocessor, which receives printing jobs in a digital form from desktop publishing (DTP) systems (not shown), and renders the digital information for imaging. The rendered information and imaging device control data are communicated between DFE 104 and imaging device 108 over interface line 112.

Figure 2:
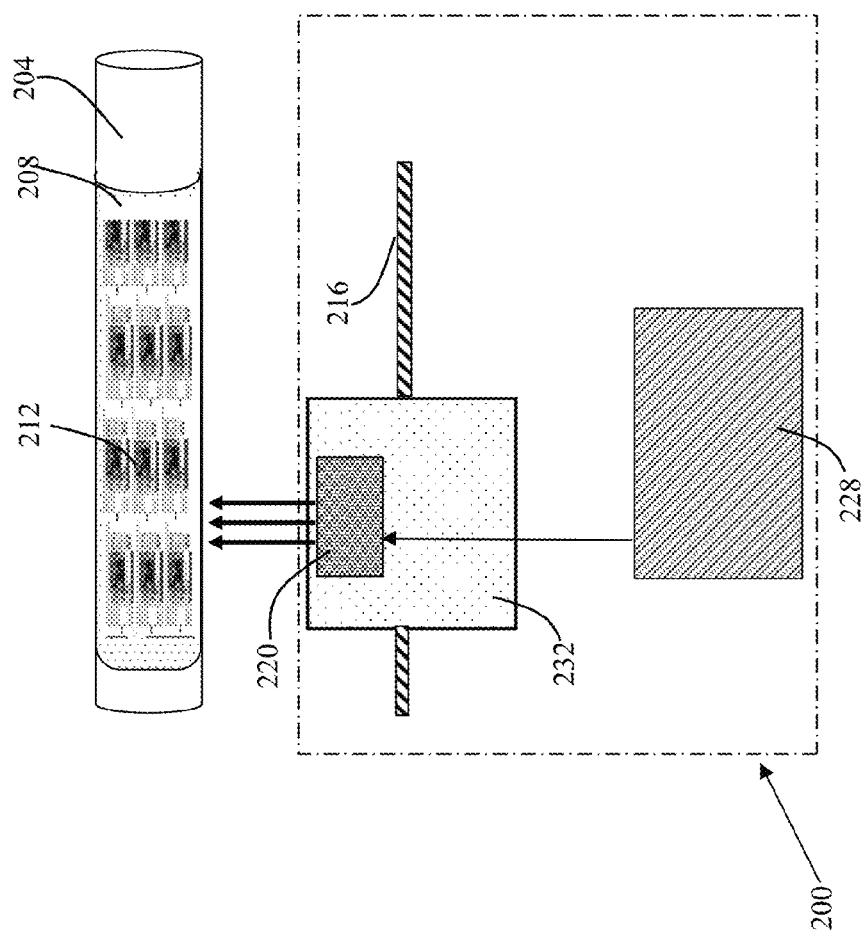
FIG. 2 represents, in diagrammatic form, a prior art laser imaging head situated on the imaging carriage imaging on a plate mounted on an imaging cylinder.

FIG. 2 shows an imaging system 200. The imaging system 200 includes an imaging carriage 232 an imaging head 220, which comprises a plurality of lasers and which is mounted, imaging head 220 are controlled by controller 228. The imaging head 220 is configured to image on a substrate 208, the substrate can be a film to be attached as a mask to a flexographic plate, or alternatively a flexographic plate that will be directly imaged by imaging system 200. The substrate 208 is mounted on a rotating cylinder 204 for exposure. The carriage 232 is adapted to move substantially in parallel to cylinder 204 guided by an advancement screw 216. The substrate 208 is imaged by imaging head 220 to form an imaged data 212 on substrate 208.

Figure 3:
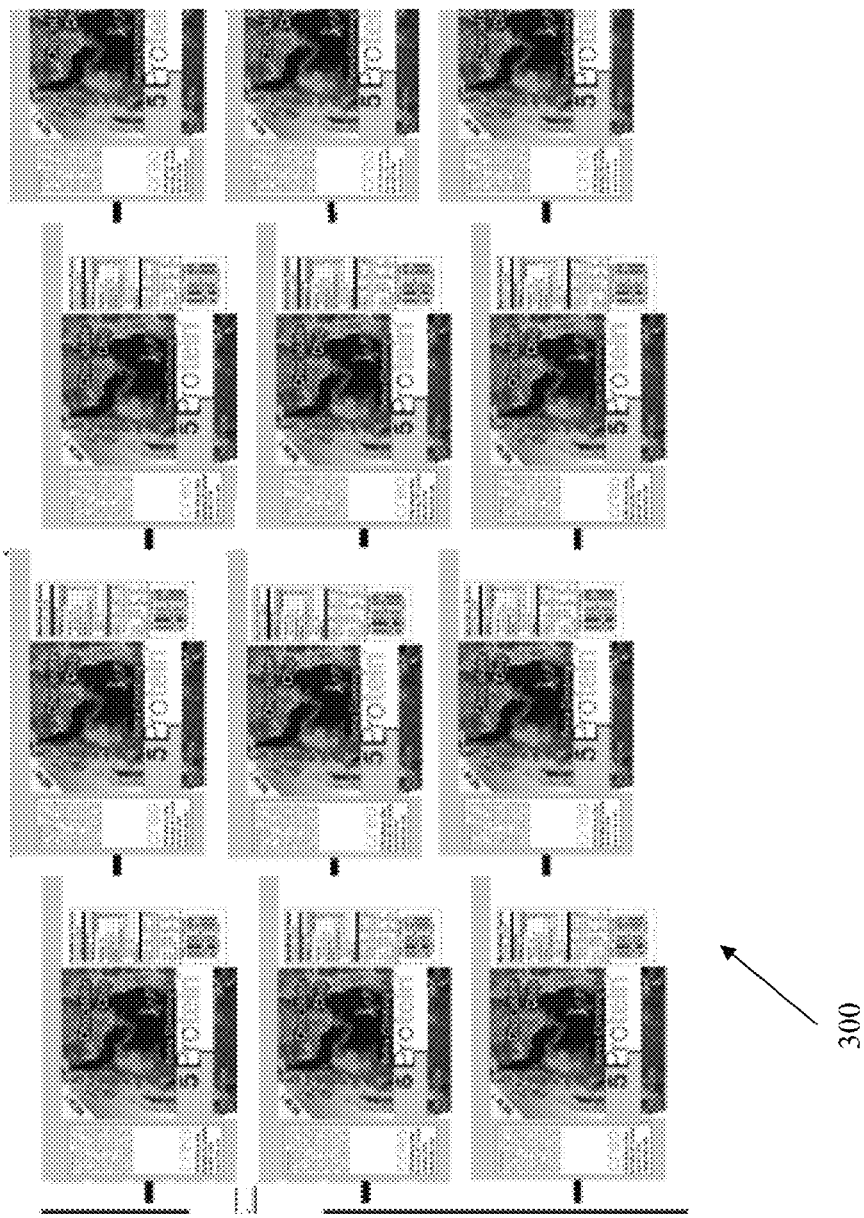
FIG. 3 shows a prior art halftone rendered image.
Figure 4:
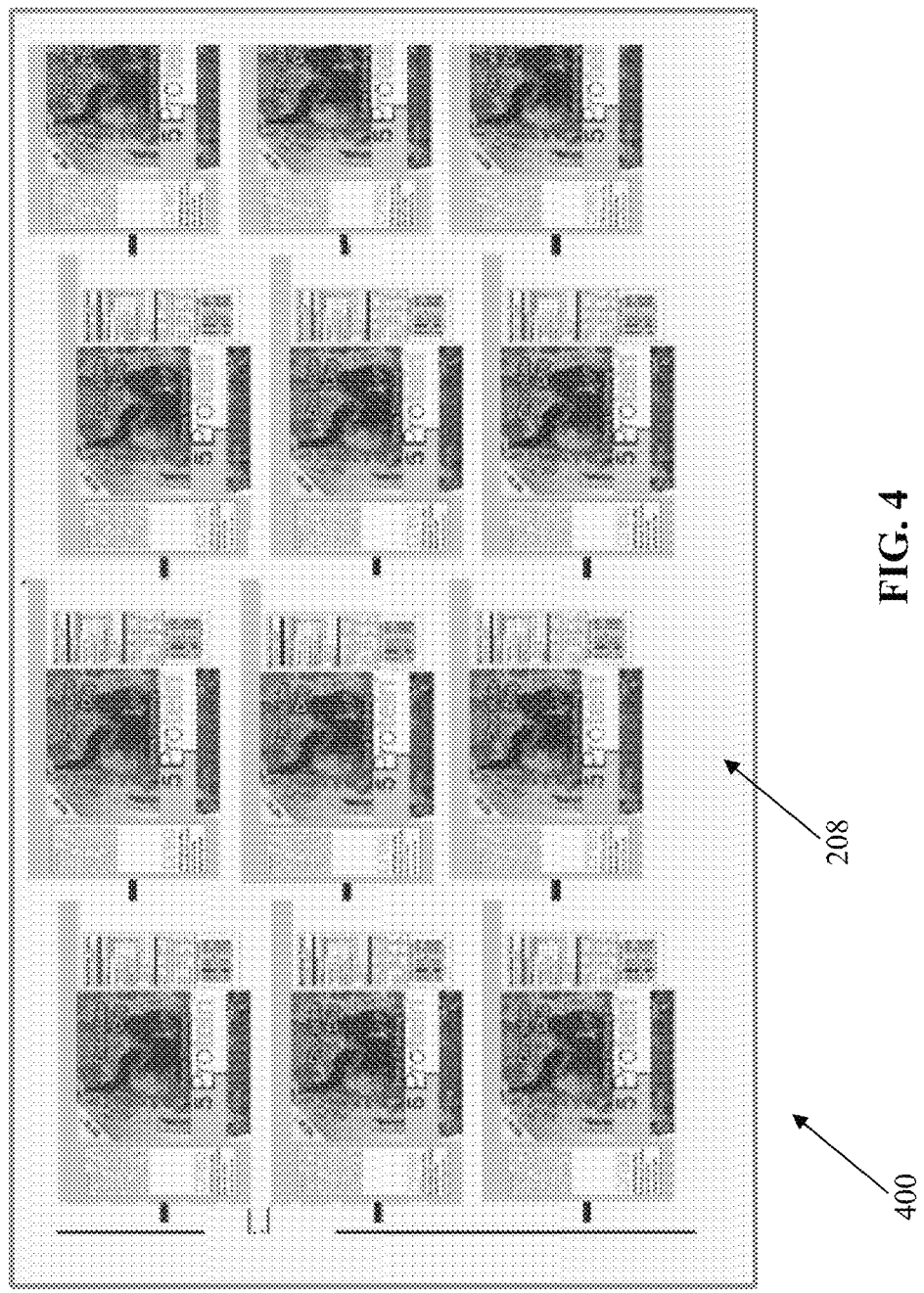
FIG. 4 shows a prior art rendered image on flexographic plate.
Figure 5:
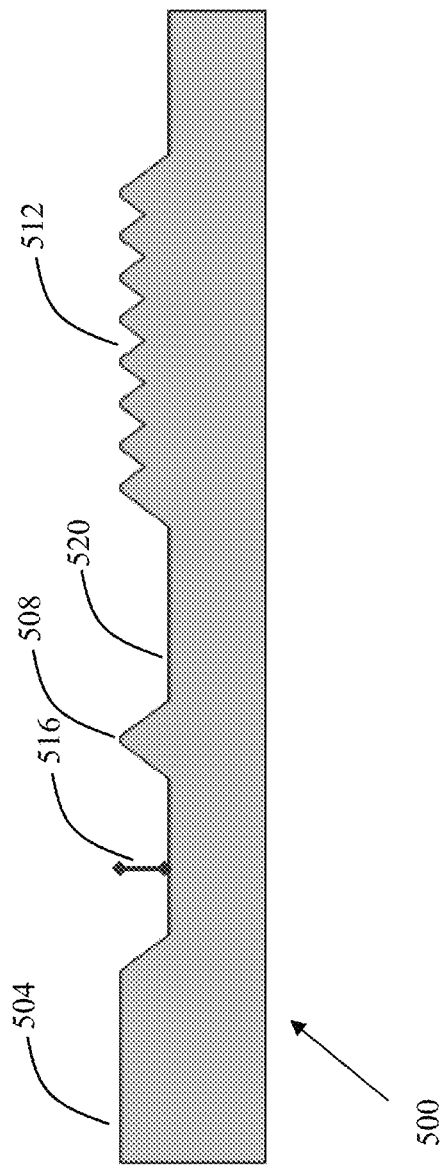
FIG. 5 shows a prior art cross-section of an imaged printing plate.
Figure 6:
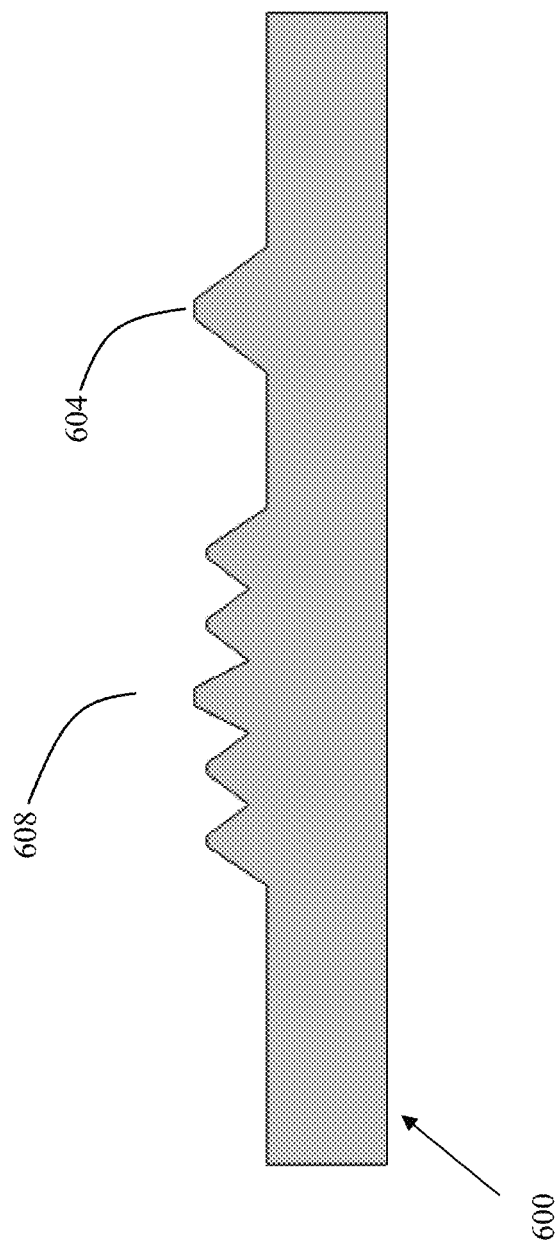
FIG. 6 shows prior art engraved dots that are too small to properly form the areas surrounding larger dots.
Figure 7:
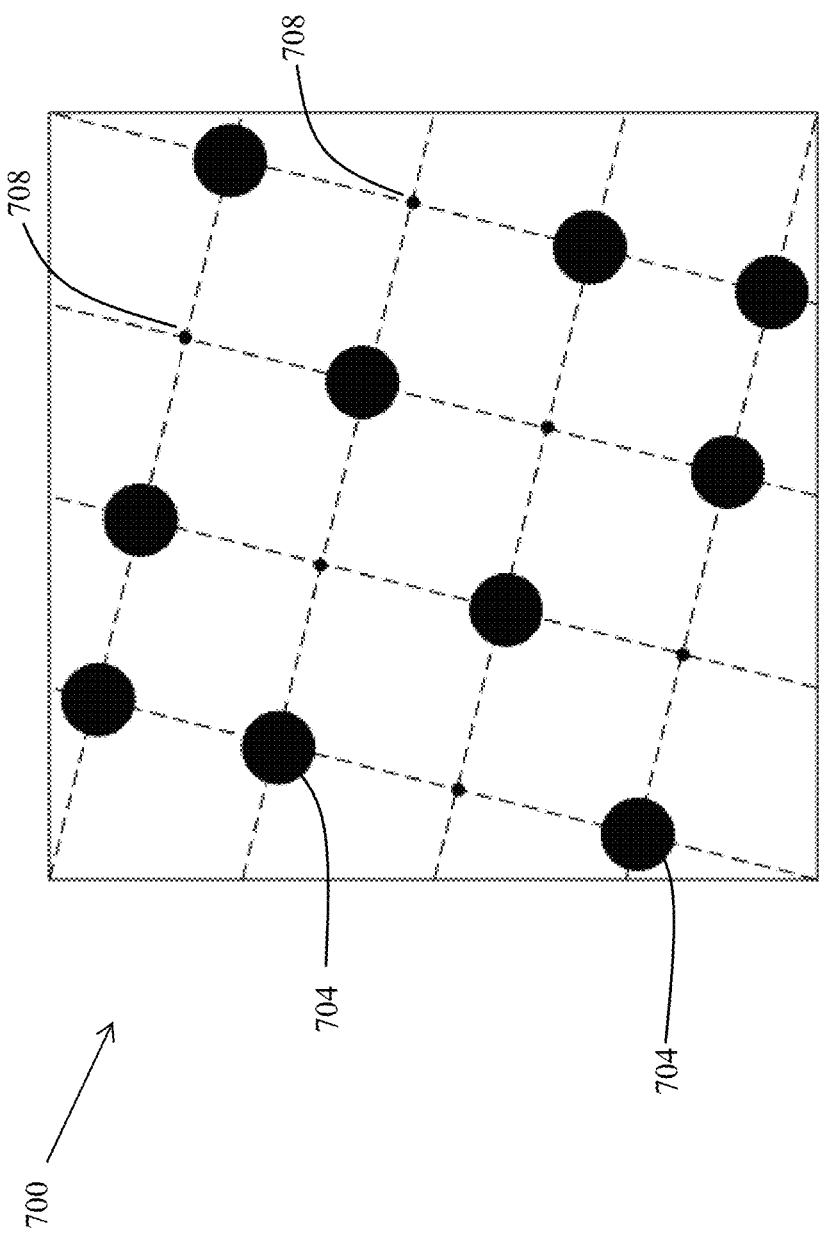
FIG. 7 shows prior art engraved flexographic plate showing small dots which are interspersed with large dots.

FIG. 3 shows a halftone rendered image 300. The rendered image 300 was prepared by DFE 104, to be further imaged on substrate 208. FIG. 4 shows rendered image 300 imaged by imaging head 220 on substrate 208 forming an imaged substrate 400.

The ideal solution to the problem of small dots with insufficient support is to raise the floor of the plate surrounding the dot. Small dots with carefully controlled size and spacing are used to modify the floor height. The method takes advantage of the side affect of back exposure that the plate material above the plate floor is partially exposed. Exposure above a threshold value causes the plate material to solidify. Exposure is a linear integrating process; therefore, front exposure 816 can be combined with back exposure 804 to exceed the threshold 808. The exposure intensity 820 as a function of distance into the plate is shown in the FIG. 8.

The figure shows the ultra violet (UV) radiation intensity as a function of distance though the plate thickness. This intensity decays as it penetrates the plate material because of absorbers added to the polymer mix. The intensity changes according to Beer's Law:

$$I = I_0 e^{-\alpha x}$$

Figure 8:
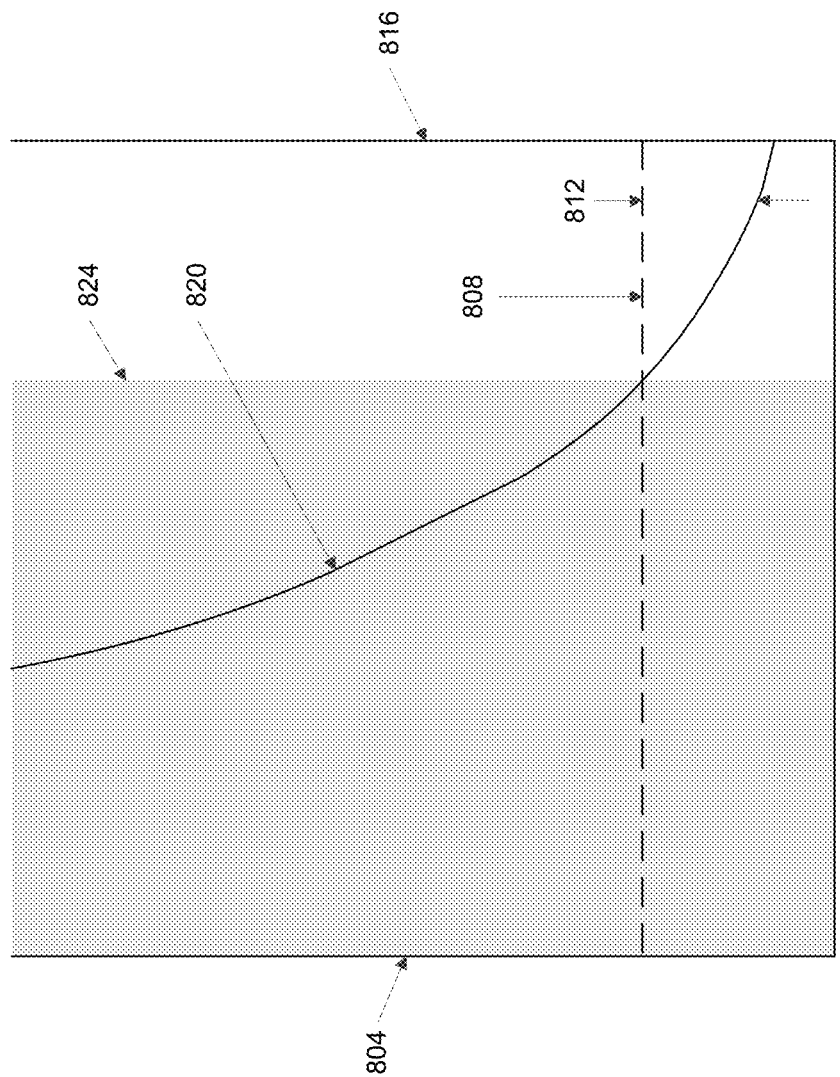
FIG. 8 shows exposure intensity as a function of distance into the plate.

Plate material that is not exposed above a threshold value is washed away when the plate is processed. The shaded area shows the thickness that remains and where the plate floor 824 is. However, the plate material between the plate floor and the front surface of the plate is partially exposed. The exposure deficit 812, shown in FIG. 8, represents the additional exposure needed to solidify the remainder of the plate. Note that near the plate floor, very little additional energy is required to exceed the threshold value. Therefore a front exposure that does not create a dot can be used to raise the plate floor.

Figure 9A:
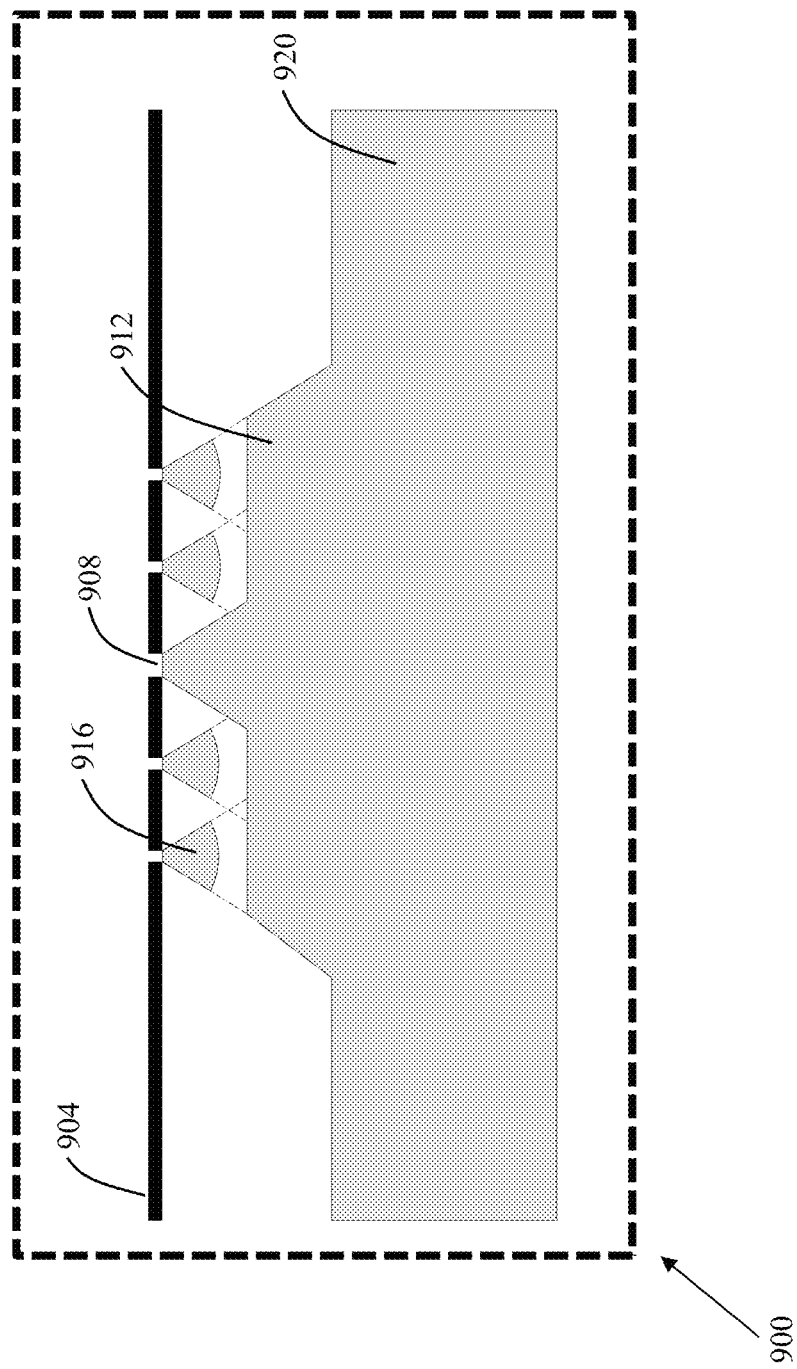
FIG. 9A shows a cross-section of an engraved isolated printing dot surrounded by non-printing scaffold dots.
Figure 9B:
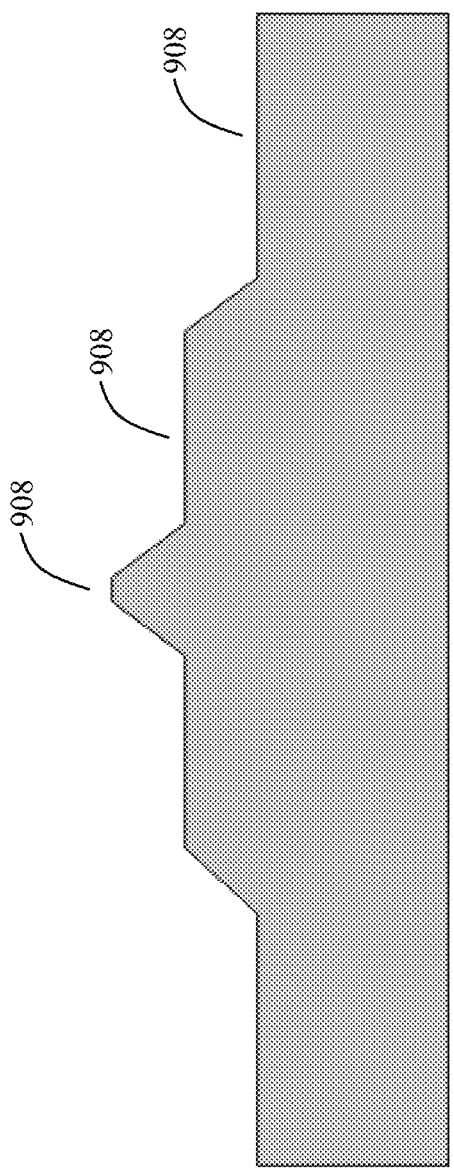
FIG. 9B shows a cross-section of the engraved isolated printing dot after the surrounded by non-printing scaffold dots have been washed out by a solvent.

The printing plate cross-section 900 shown in FIG. 9A shows and isolated printing dot 908 surrounded by non-printing scaffold dots 916. The scaffold dots 916 are used to raise the floor 912 of the plate surrounding the isolated dot. The cross-section 900 depicts a one-dimensional profile. Printing dots 908 and non-printing scaffold dots 916 are formed on an imaged film mask 904 prior to UV exposure. FIG. 9B shows a cross-section of the isolated printing dot 908 with raised floor 912 and plate floor 920 after the scaffold dots 916 have been removed by the solvent. Alternatively substrate 208 is a printing plate which can be imaged directly by imaging system 200 without a need to use intermediate steps of imaging a mask on a film, laminating the film on the plate and to apply UV exposure steps.

Figure 10:
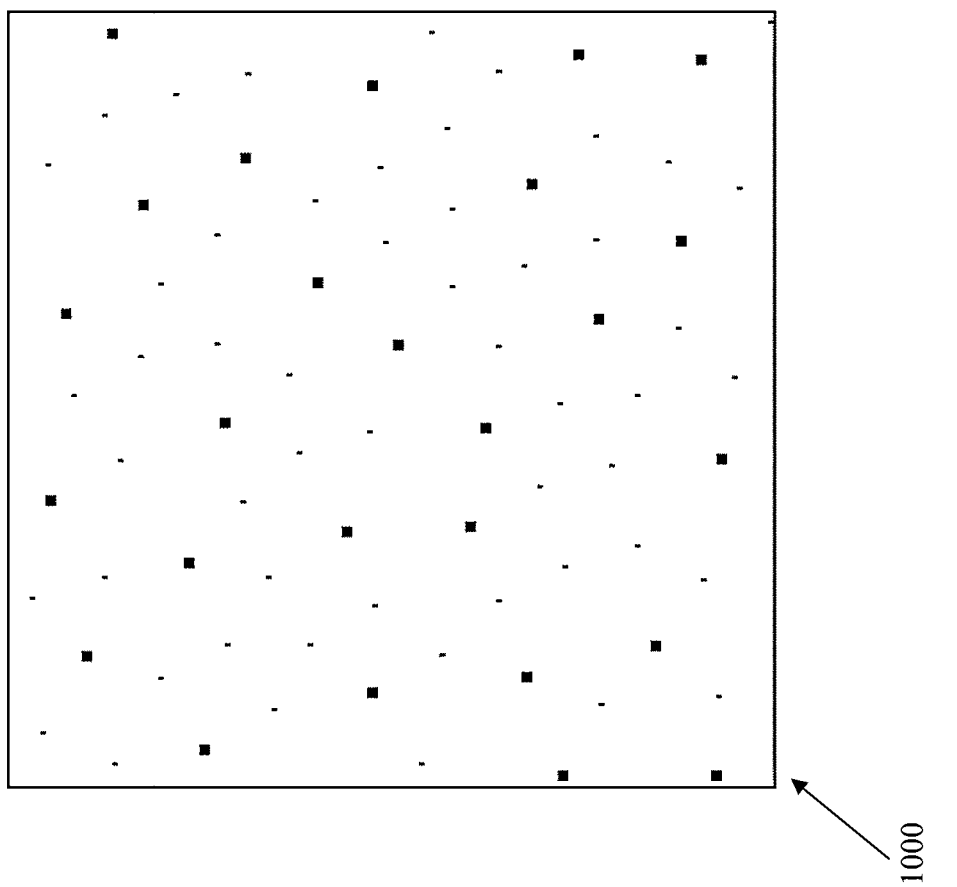

FIG. 10 shows a two-dimensional top view of how a typical halftone 1000 in the highlights might look like.

The intensity of the scaffold dot beam decays with distance from the mask 904 because of absorption in the plate (Beer's Law) and because the beam expands as it propagates through the plate (Inverse Square Law). The intensity equation is:

$$I = I_0 \frac{e^{-\alpha x}}{x^2}$$

The intensity drops rapidly and passes below the threshold for plate solidification. If the dot is small enough ($I_0$ is small enough) then intensity will drop below threshold before reaching the plate floor. The resulting conical plug (of the scaffold dots) 916 of solid plate material will be washed away by the solvent in the plate processing step.

As seen in the cross-section, the beam continues to the floor of the plate and beyond. Near the floor, the additional exposure needed to solidify the polymer is small and the floor is raised (912). In addition, the beams from adjacent dots begin to overlap and the added exposure further raises the floor. This places an additional restriction on the scaffold dots—the density of the dots cannot exceed a maximum value else the floor will rise to meet the solidified conical plugs and the plugs will not be washed away.

Figure 11:
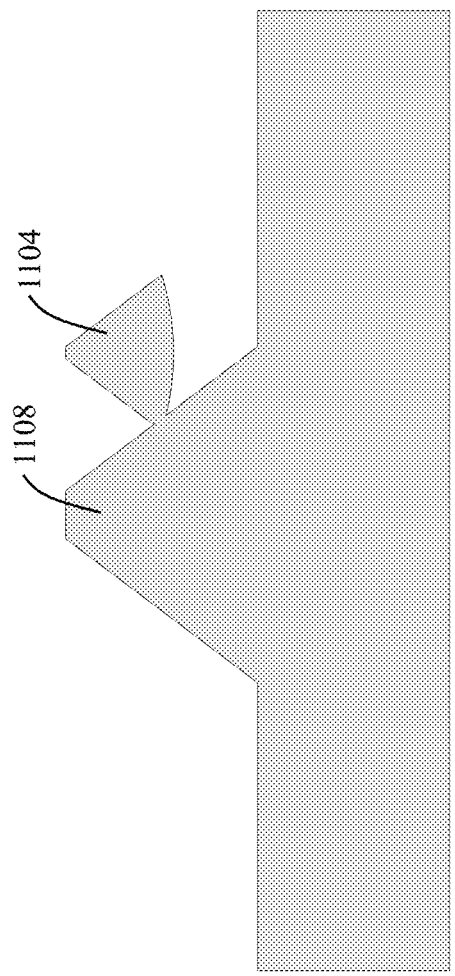
FIG. 11 shows scaffold dot placements required to ensure that scaffold dots do not become attached to other imaged features on the plate.

A further restriction on scaffold dot 916 placements is required to ensure that scaffold dots do not become attached to other imaged features on the plate. FIG. 11 illustrates the problem. With the scaffold dot plug 1104 anchored to an adjoining feature 1108, the dot will not be washed away by the solvent. The solution is to maintain a minimum distance between scaffold dots and other features.

Figure 12:
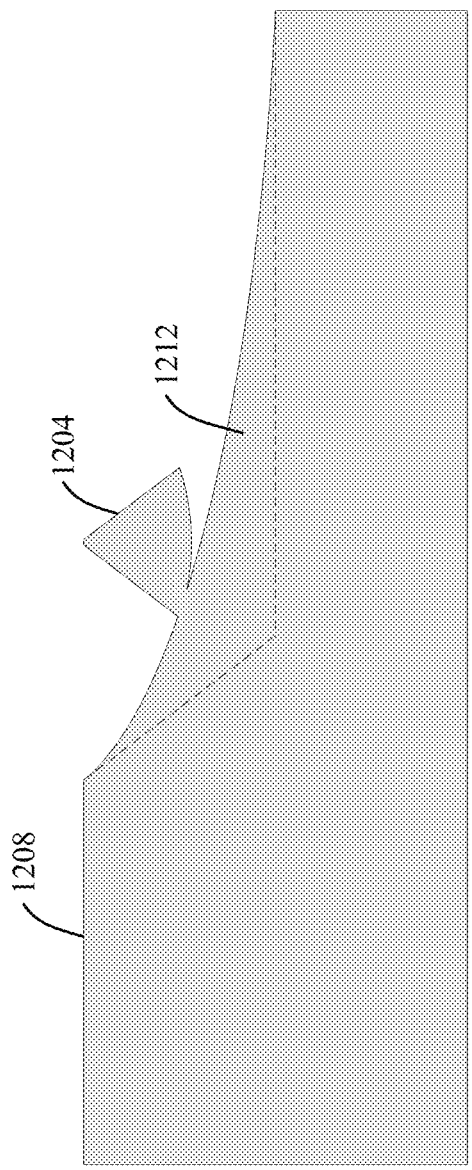
FIG. 12 shows another restriction with the placement of scaffold dots.

There is one additional restriction with the placement of scaffold dots 916 that is illustrated in FIG. 12. The figure shows part of a large plate feature 1208. The front exposure to create this feature propagates through the plate and is partially scattered by changes in refractive index as the plate material forms cross-links. This scatter spreads out and raises the floor near the edge of the feature 1208. The effect is proportional to the size of the feature and decays with distance from the edge of the feature. Small features 1204 do not raise the floor significantly as there is insufficient energy in the refractive scatter. For reference, the dotted line in the figure shows the location of the floor had no scatter occurred 1212. FIG. 12 shows how a scaffold dot 916 could become attached to this raised floor. Detection of a raised floor and suppression of scaffold dots in the area of that floor is a further aspect of this invention.

In summary the main features of this invention are: Use small dots 916 (scaffold dots) that have insufficient exposure to solidify all the way to the plate floor. Control the maximum density scaffold dots to ensure that floor is not raised to meet the bottom of scaffold dot, maintain spacing of the scaffold dots far enough away from other features to ensure that they do not connect and refrain from placing scaffold dots in regions where the floor could be raised by back scatter.

While the invention has been described with respect to a limited number of embodiments, these should not be construed as limitations on the scope of the invention, but rather as exemplifications of some of the preferred embodiments. Other possible variations, modifications, and applications are also within the scope of the invention. Accordingly, the scope of the invention should not be limited by what has thus far been described, but by the appended claims and their legal equivalents.

PARTS LIST

104 digital front end (DFE)
108 imaging device
112 interface line
200 imaging system
204 rotating cylinder
208 substrate
212 imaged data on substrate
216 screw
220 imaging head
228 controller
232 carriage
300 rendered halftone image to be imaged on substrate
400 rendered image imaged on substrate
500 flexographic printing plate profile
504 solid area
508 isolated dot
512 array of closely spaced dots created by a halftone screen
516 plate relief
520 plate floor
600 flexographic printing plate profile
604 printing dot
608 partially printed dots
700 halftone screen
704 halftone dots
708 supporting dots
804 back of plate
808 threshold
812 exposure deficit
816 front of plate
820 exposure intensity
824 plate floor
900 printing plate cross-section
904 exposure mask (TIL)
908 printing dot
912 raised floor
916 scaffold dot
920 plate floor
1000 highlights view in a typical halftone
1104 scaffold dot plug
1108 plate adjoining feature
1204 small plate features
1208 large plate feature
1212 plate floor had no scatter occurred

The invention claimed is:

1. A method for forming an image on a flexographic plate comprising:
   exposing a back of said flexographic plate to form a floor;
   providing a screened image;
   locating isolated dots on said screened image;
   exposing a front of said flexographic plate with said screened image, wherein said frontal exposure forms said screened image, isolated dots and scaffold dots adjacent, wherein said scaffold dots are to said isolated dots on said flexographic plate, and wherein said scaffold dots do not extend to said floor; and
   applying a solvent to wash away unexposed material and said scaffold dots from said flexographic plate.

2. The method of claim 1 wherein exposing comprises:
   imaging an intermediate film with said screened image;
   laminating said film to top of said flexographic plate;
   exposing said flexographic plate though said film; and
   removing said film from said flexographic plate.

3. The method of claim 1 further comprising:
   drying said flexographic plate to remove said solvent.

4. The method of claim 1 wherein exposing comprises:
   exposing with a laser.

* * * * *